United States Patent
Ponton et al.

(10) Patent No.: US 6,633,470 B2
(45) Date of Patent: Oct. 14, 2003

(54) OVERVOLTAGE PROTECTION CIRCUIT FOR BIDIRECTIONAL TRANSMISSION GATE

(75) Inventors: Kent Aaron Ponton, Palm Bay, FL (US); James Winthrop Swonger, Palm Bay, FL (US)

(73) Assignee: Intersil Americas Inc., Milpitis, CA (US)

( * ) Notice: Subject to any disclaimer, the term of this patent is extended or adjusted under 35 U.S.C. 154(b) by 386 days.

(21) Appl. No.: 09/741,221

(22) Filed: Dec. 19, 2000

(65) Prior Publication Data

US 2002/0075617 A1 Jun. 20, 2002

(51) Int. Cl.$^7$ ................................................. H02K 3/20
(52) U.S. Cl. ........................ 361/91.1; 361/18; 361/58; 361/91.5; 327/434
(58) Field of Search ..................... 361/18, 91.1, 58, 361/91.5; 327/434

(56) References Cited

U.S. PATENT DOCUMENTS

| | | | |
|---|---|---|---|
| 4,322,767 A | 3/1982 | El Hamamsy et al. | ........ 361/56 |
| 5,917,220 A | 6/1999 | Waggoner | ........ 257/360 |
| 6,025,746 A | 2/2000 | So | ........ 327/325 |
| 6,081,412 A | * | 6/2000 | Duncan et al. ........ 361/86 |

* cited by examiner

Primary Examiner—Stephen W. Jackson
Assistant Examiner—James A Demakis
(74) Attorney, Agent, or Firm—Allen, Dyer, Doppelt, Milbrath & Gilchrist, P.A.

(57) ABSTRACT

A clamping MOS transistor-based overvoltage protection circuit is provided for a bidirectional transmission gate FET coupled between input and output ports. When the voltage applied to the input port exceeds the supply voltage by a MOS gate threshold, the clamping MOS transistor is turned on, pulling the voltage applied to the gate of the transmission gate FET very close to the applied overvoltage level by a voltage differential less than a diode drop. This reduction in Vgs of the transmission gate FET reduces its source-to-drain current, as the device operates deeper in a sub-threshold region, increasing the overvoltage rating for the same leakage current specification. In a second embodiment, a clamping MOS device is coupled on either side of the source-drain path of the transmission gate's FET device.

19 Claims, 5 Drawing Sheets

OVERVOLTAGE PROTECTION CIRCUIT FOR BIDIRECTIONAL TRANSMISSION GATE

FIELD OF THE INVENTION

The present invention relates in general to electronic systems and components, and is particularly directed to a new and improved circuit architecture for providing overvoltage protection for a bidirectional transmission gate, particularly one formed of complementary polarity field effect transistors.

BACKGROUND OF THE INVENTION

Figure 1:
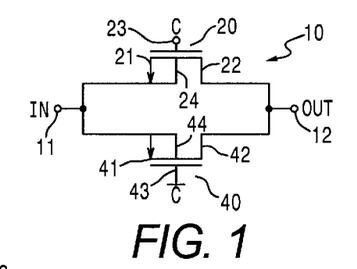
FIG. 1 diagrammatically illustrates the basic circuit architecture of a conventional complementary polarity FET-based bidirectional transmission gate.

FIG. 1 diagrammatically illustrates the basic circuit architecture of a conventional complementary polarity FET-based bidirectional transmission gate 10 commonly employed in a variety of electronic circuits and systems for selectively switching analog signals between a first port 11 and a second port 12. While bidirectional switching allows either port to be employed as an input or an output, for purposes of avoiding confusion in the use of dual terms for both ports, throughout the following present description, port 11 will be designated as an input port IN and port 12 will be designated as an output port OUT.

Figure 2:
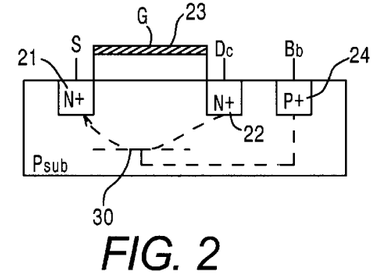
FIG. 2 is a diagrammatic cross-sectional view of the NMOS device of the bidirectional transmission gate of FIG. 1.
Figure 3:
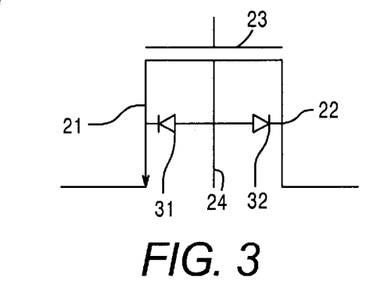
FIG. 3 shows respective parasitic emitter-base and base-collector pn diodes of the NMOS device of FIG. 2.

The complementary polarity FET-configured transmission gate 10 of FIG. 1 contains a first, N-channel MOSFET (or NMOS) device 20 (a cross-section of which is diagrammatically illustrated in FIG. 2) having its (N+) source 21 coupled to input port 11 and its (N+) drain 22 coupled to output port 12. The P-type body 24 of NMOS device 20 is coupled to its source 21 (by way of an external connection not show in FIG. 2), and its gate 23 is coupled to a control terminal C. The body-source connection may be represented as a parasitic base connection of a parasitic NPN transistor, shown in broken lines 30 in the device cross-section of FIG. 2, and having respective parasitic emitter-base and base-collector pn junctions 31 and 32 of the NMOS device schematic shown in FIG. 3. To place the NMOS device 20 in the OFF or non-conducting condition the control terminal C is coupled to receive a low logic level switching control voltage such as one corresponding to a negative supply voltage; to place NMOS device 20 in the ON or conducting condition, the control terminal C is coupled to receive a high logic level switching control voltage, such as a positive supply voltage.

The transmission gate 10 of FIG. 1 further contains a second, P-channel MOSFET (or PMOS) device 40 (a cross-section of which is diagrammatically illustrated in FIG. 4) having its (P+) source 41 coupled to input port 11 and its (P+) drain 42 coupled to output port 12. The N-type body 44 of PMOS device 40 is coupled to its source 41 (as by way of an external connection not shown in FIG. 4), and its gate 43 is coupled to a control terminal CBAR. The body-source connection can be represented as a parasitic base connection of a parasitic PNP transistor, shown in broken lines 50 in the device cross-section of FIG. 4, and having respective parasitic emitter-base and base-collector pn junctions 51 and 52 of the PMOS device schematic shown in FIG. 5.

Figure 4:
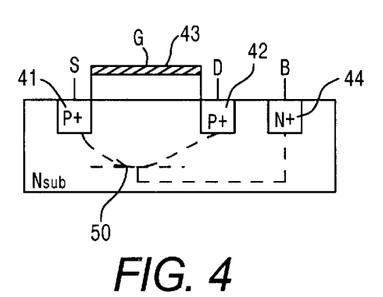
FIG. 4 is a diagrammatic cross-sectional view of the PMOS device of the bidirectional transmission gate of FIG. 1.
Figure 5:
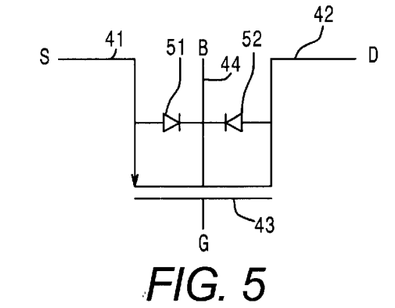
FIG. 5 shows respective parasitic emitter-base and base-collector pn diodes of the PMOS device of FIG. 4.

To place the PMOS device 40 is the OFF or non-conducting condition, its control terminal CBAR is coupled to receive a high logic level switching control voltage such as one corresponding to a positive supply voltage. To place PMOS device 40 is the ON or conducting condition, its control terminal CBAR is coupled to receive a low logic level switching control voltage, such as a negative supply voltage.

2

Figure 6:
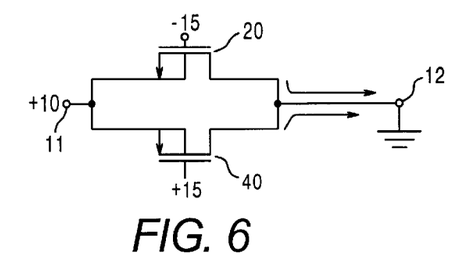
FIG. 6 shows the operation of the complementary polarity FET-based bidirectional transmission gate of FIG. 1 for a non-overvoltage condition.

In operation, NMOS device 20 may have a threshold voltage $V_{NMOS}th=+1V$, while PMOS device 40 may have a threshold voltage $V_{PMOS}th=-1V$, with a supply voltage range of +/-15 volts. For an input voltage Vin of +10v applied to input port 11, and a ground or zero potential coupled to the output port 12, as diagrammatically illustrated in FIG. 6, NMOS device 20 has a $Vgs_{20}=-25V$ (-25V<1V), while PMOS device 40 has a $Vgs_{40}=+5V$ (+5V>-1V). As a result, each of NMOS device 20 and PMOS device 40 is turned OFF. Namely, the transmission gate 10 can be maintained. in the OFF condition as long as the input voltage falls within the supply voltage range.

Figure 7:
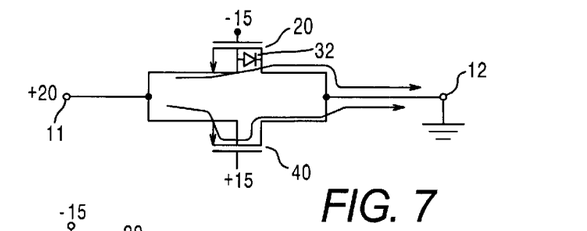
FIG. 7 shows the operation of the complementary polarity FET-based bidirectional transmission gate of FIG. 1 for an input port overvoltage condition.

On the other hand, for an excessively positive or overvoltage input voltage Vin of +20 v applied to input port 11, and a ground or zero (0) potential coupled to the output port 12, as shown diagrammatically in FIG. 7, NMOS device 20 has a $Vgs_{20}=-35V$ (-35V<1V), so that NMOS device 20 is apparently turned OFF. However, PMOS device 40 has a $Vgs_{40}=-5V$ (which is less than -1V), so that PMOS device 40 is undesirably turned ON and provides substantial current flow therethrough. Moreover, even though NMOS device 20 is in the OFF state, the +20 volt applied to the input port 11 is sufficient to forward bias its parasitic base-collector pn junction 32 and provide an additional current leakage path through NMOS device 20 between ports 11 and 12.

Figure 8:
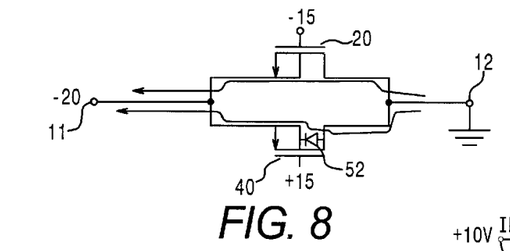
FIG. 8 shows the operation of the complementary polarity FET-based bidirectional transmission gate of FIG. 1 for an output port overvoltage condition.

Similarly, for an excessively negative or overvoltage input voltage Vin of -20 v applied to input port 11, and a ground or zero (0) potential coupled to the output port 12, shown diagrammatically in FIG. 8, the NMOS device 20 has a $Vgs_{20}=+5V$ (>+1V), so that the NMOS device 20 is undesirably turned ON, while PMOS device 40 has a $Vgs_{40}=+35V$ (which is greater than -1V), so that PMOS device 40 is turned OFF. Although the PMOS device 40 is ostensibly in the OFF state, the -20 volt applied to the input port 11 is sufficient to forward bias its parasitic base-collector pn junction 52 and thereby provide an additional current leakage path through PMOS device 40 between ports 11 and 12. Thus, the transmission gate 10 fails to remain OFF for an input voltage outside the supply voltage range (regardless of polarity).

Figure 9:
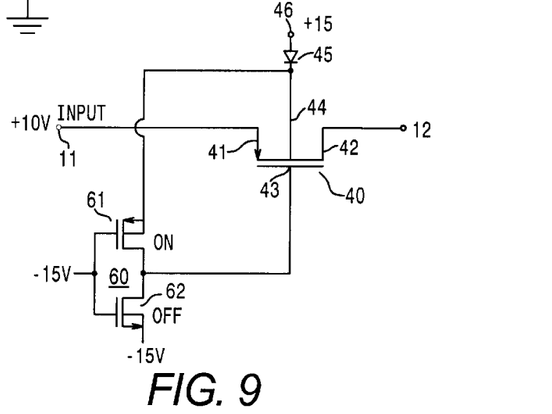
FIG. 9 diagrammatically illustrates a modification of a respective PMOS portion of the transmission gate of FIG. 1 to incorporate a blocking diode between the body and a respective supply rail, and a complementary MOSFET inverter in circuit between the body and an opposite polarity supply rail.

FIG. 9 diagrammatically illustrates a modification that may be incorporated into each of the complementary polarity halves of the transmission gate described above, to incorporate a 'blocking' diode coupled between the body and a respective supply rail, as well as a complementary MOSFET inverter coupled in circuit between the body and an opposite polarity supply rail. In order to reduce the complexity of the drawings and facilitate the present description, only the PMOS device 40 of the transmission gate will be described. It is to be understood, however, that the description applies equally to the complementary NMOS device 20 for a change in polarity of the parameters of the components and applied voltages.

More particularly, in the modified circuit of FIG. 9, a 'blocking' diode 45 is installed between the body 44 and a (+15V) positive supply terminal 46. In addition, a complementary MOSFET inverter 60 comprised of a PMOS transistor 61 and an NMOS transistor 62, is coupled in circuit between body 44 and a (-15V) negative supply terminal 47. The gate 43 of PMOS transistor 40 is coupled to the common drain connections of PMOS device 61 and NMOS device 62, and the common gates of devices 61 and 62 are coupled to a control terminal (to which a logic low input voltage (-15V) is coupled for an OFF condition of the transmission gate). In terms of a practical implementation, an MOS device may be coupled between the diode 45 and the body 44 of the PMOS device 40 for the purpose of isolating the body 44 from the positive supply rail, when the transmission gate is turned ON, in order to connect the transmission gate's NMOS and PMOS bodies together, to provide a flatter on-resistance vs. input voltage caused by the constant body source-voltage allowed by the configuration shown.

Figure 10:
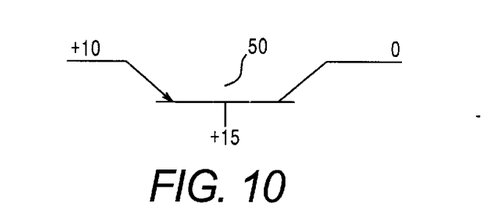
FIG. 10 shows the condition of the parasitic PNP transistor of the transmission gate of FIG. 9 for a non-overvoltage condition.

For the above parameters, as long as the input voltage remains within the supply voltage range (+/−15V), the transmission gate can be controllably maintained in the OFF condition. (As shown in FIG. 10, the parasitic PNP transistor 50 will also remain OFF, with both emitter-base and base-collector PN junctions being reverse-biased, so that the parasitic transistor remains turned OFF.) For a voltage outside this range applied to the input port, the two complementary transmission gate transistors remain off.

Figure 11:
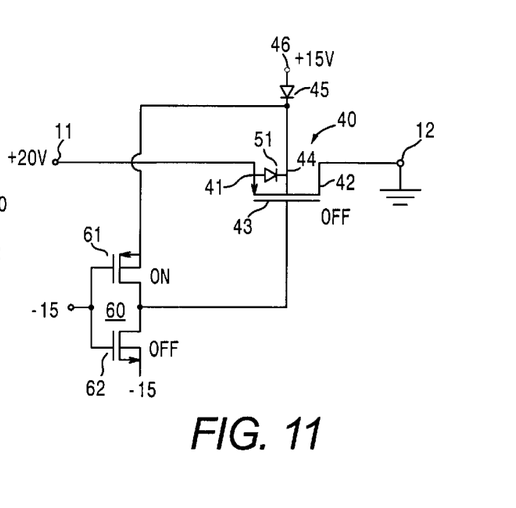
FIG. 11 shows the operation of the transmission gate of FIG. 9 for an input port overvoltage condition.

For the case of a +20V overvoltage applied to input port 11, as shown in FIG. 11, the PMOS device's blocking diode 45 is reverse-biased, which allows the node 44 to exceed the supply voltage (+15V). The body potential increases toward the +20V input voltage minus the internal diode drop (e.g., 0.6V) of the PMOS pn junction 51 which is forward-biased. With PMOS 61 device of inverter 60 being turned ON, the potential at the gate 43 of PMOS transistor 40 will rise toward the higher body potential (20 v−0.6 v=19.4 v). This places PMOS gate in an OFF condition (or approximately sub-threshold region), as the $Vgs_{40}$ is not sufficient to turn device 40 ON. The parasitic PNP bipolar transistor 50 is not turned on, since this transistor's base (the body 44 of the PMOS device 40) is not provided a major current path, so that it does not fully turn on (does not saturate).

Figure 12:
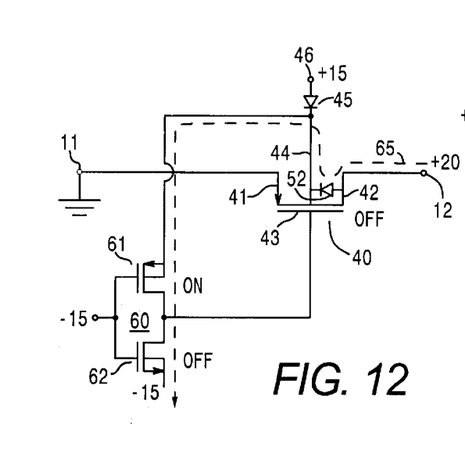
FIG. 12 shows the operation of the transmission gate of FIG. 9 for an output port overvoltage condition.

On the other hand, where a +20V overvoltage is applied to the output port 12, as shown in FIG. 12, the PMOS device's blocking diode 45 is reverse-biased, through the forward-biased pn junction 52, which allows the potential of the body 44 to rise to within a diode drop of the overvoltage potential, thus increasing the gate voltage through the turned-on PMOS 61 device of inverter 60 to the higher body potential (20V−0.6V=19.4V). This places the PMOS device 40 in the OFF state. However, a relatively large Vds (drain-source voltage) is thereby imparted to the NMOS device 62 within the inverter 60, causing a significant flow of leakage current shown by broken lined arrow 65.

This increased leakage current, in turn, increases the ohmic voltage losses—causing a larger Vgs and also allowing more parasitic PNP base current to flow than if the leakage current did not exist or is of a smaller amount. This current leakage problem is aggravated by the use of a larger transmission gate transistor to provide a low on-resistance requirement. As the size of the transmission gate transistor is increased, more leakage current will flow for the same value of Vgs. This causes the overvoltage protection rating for a given switch leakage to be lower than if the problem did not exist.

SUMMARY OF THE INVENTION

In accordance with the present invention, this reduced overvoltage protection rating problem is successfully remedied by incorporating at least one auxiliary 'clamping' MOS transistor in circuit with the overvoltage path and the gate terminal of the transmission gate MOS transistor. Pursuant to a first embodiment of the invention, a single auxiliary clamping MOS device may be coupled in circuit with the input path as long as there is a defined output and only the input is subject to the possibility of an overvoltage condition. The clamping MOS device-modified circuit functions in substantially the same manner as the circuit of FIG. 11, described above, with the following exception.

When the voltage applied to the input port exceeds the supply voltage by the MOS gate threshold, the auxiliary clamping MOS transistor is turned on, thereby 'pulling' the voltage applied to the gate of the transmission gate FET very close to the applied overvoltage level by a voltage differential that is less than a diode drop. This reduction in Vgs of the transmission gate MOSFET reduces its source-to-drain current, as the MOS device now operates deeper in its sub-threshold region, thereby increasing the overvoltage rating for the same leakage current specification.

The inability of the single clamping device-based embodiment to provide overvoltage protection for an overvoltage applied to either the input port or the output port of the transmission gate is successfully remedied a second embodiment of the invention, in which a clamping MOS device is coupled on either side of the source-drain path of the transmission gate's MOS device. In addition, rather than coupling the gate of a respective clamping device to the supply voltage terminal as in the first embodiment, the gates of the clamping devices are coupled in circuit with and controlled by associated clamping control MOS devices.

These additional clamping control devices have their source-drain paths coupled between the supply voltage and the gates of the clamping devices; also their gates are coupled to respective ones of the input and output ports. By installing such clamping control devices between the supply rail and the gates of the actual clamping devices on either side of the MOS transmission gate device, only that clamping device installed on the side of the transmission gate encountering the overvoltage condition will be turned on, whereas the clamping device on the opposite side of the transmission gate will be held off (by the blocking action of its associated turned-off clamping control device).

When a respective clamping control transistor is turned on, it causes a voltage that is very close to the supply rail voltage to be applied to the gate of its associated clamping transistor. Since the source of the clamping transistor is coupled to the port to which the overvoltage is applied, the clamping transistor is turned on, providing the intended overvoltage protection. The other clamping control transistor is off, thereby putting a blocking diode in and allowing the other diode to forward bias, thus applying the overvoltage to the gate of the other clamping transistor, keeping it off. At the conclusion of the overvoltage condition, the appropriate clamping control transistor for the non-overvoltage port will turn on the previous, off state (during overvoltage condition), thereby shorting out an associated source-drain diode, causing accumulated charge to be drained off the gate of the clamping transistor, reducing the voltage for normal operation.

DETAILED DESCRIPTION

In order to facilitate the present description, and reduce the complexity of the drawings, the various embodiments of the invention will be described for the case of the PMOS device path through the bidirectional transmission gate, it being readily understood to those skilled in the art that the description applies equally to the complementary NMOS device for a change in polarity of the parameters of the components and applied voltages. To this end, FIG. 13 diagrammatically illustrates a first embodiment of the invention, for the case of a defined output (e.g., zero or ground) voltage being applied to the output port 12, and only the input port 11 being subject to the possibility of an overvoltage condition (e.g., +20V).

Pursuant to this first embodiment, a single auxiliary clamping PMOS device 70 has its source 71 coupled in circuit with the input port 11 and its drain 72 coupled to the gate 43 of the PMOS transmission gate transistor 40, which is coupled to the common drain node of PMOS device 61 and NMOS device 62 of the inverter 60. In addition, the auxiliary clamping MOS transistor 70 has its gate 73 coupled to the (+15V) supply terminal 46 and its body 74 coupled to the body 44 of the transmission gate PMOS transistor 40, and thereby to the source-body connection of PMOS device 61 of inverter 60. The circuit of FIG. 13 is otherwise configured the same as the circuit of FIG. 11, described above.

Figure 13:
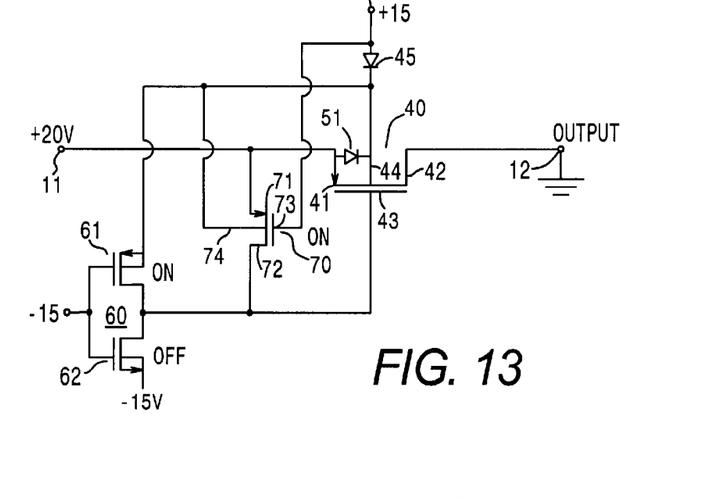
FIG. 13 diagrammatically illustrates a first embodiment of the improved transmission gate architecture of the invention.

In operation, the clamping PMOS device-modified circuit of FIG. 13 functions in substantially the same manner as the circuit of FIG. 11, with the following exception. When the voltage applied to the input port 11 exceeds the supply voltage (here +15V, as a non-limiting example) by the PMOS gate threshold, the auxiliary clamping MOS transistor 70 is turned on, thereby 'pulling' the voltage applied to the gate 43 of the PMOS transmission gate FET 40 very close to the applied overvoltage level (e.g., +20V) by a voltage differential that is less than a diode drop (e.g., 0.6V). As pointed out above, this reduction in $Vgs_{40}$ of PMOS device 40 reduces its source-to-drain current, as PMOS device 40 is now operating deeper in its sub-threshold region, thereby increasing the overvoltage rating for the same leakage current specification.

Now although the first embodiment's circuit modification of FIG. 13 works well for the case that there is a voltage at the transmission gate's output port 12, and only the input port 11 is subject to an overvoltage condition, it is unable to remedy the problem of an overvoltage condition at the output port 12. As will be described, the auxiliary clamping transistor that solves the problem of an overvoltage being applied to the input port causes overvoltage protection to fail for an overvoltage condition at the output port. As a consequence, merely coupling a further clamping MOS device in circuit with the transmission gate transistor and the output port will not solve the problem.

Figure 14:
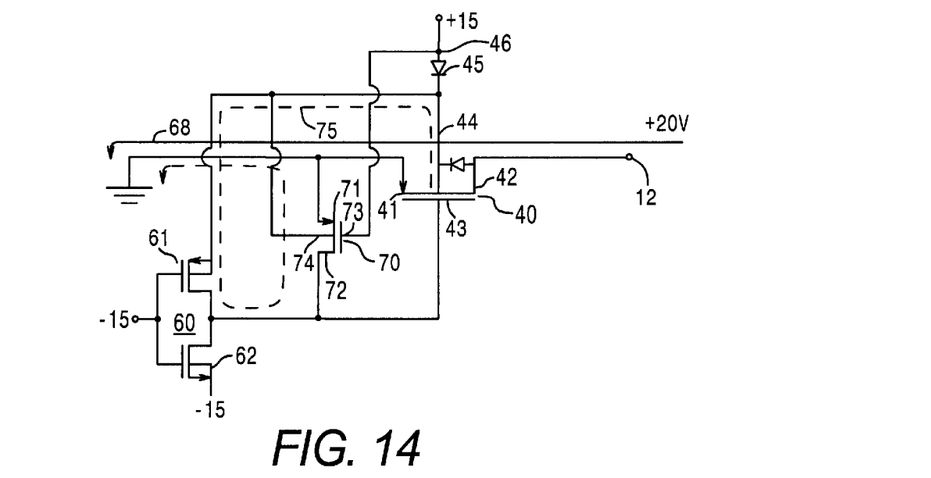
FIG. 14 shows an overvoltage condition applied to the output port of the transmission gate of FIG. 13.
Figure 15:
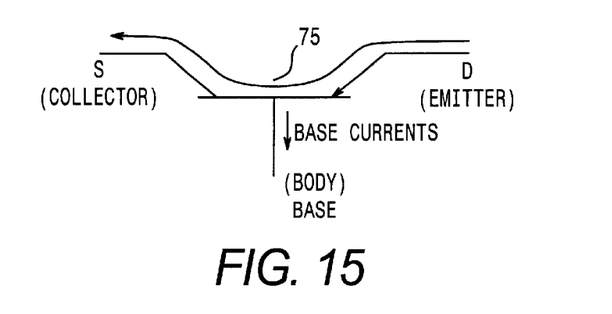
FIG. 15 is parasitic bipolar circuit diagram associated with the operation of the transmission gate of FIG. 13 for the overvoltage condition of FIG. 14.

More particularly, with reference to FIG. 14, which shows an overvoltage condition of (+20V) applied to the output port 12, the parasitic pn junction 52 will be forward biased, causing the potential of the PMOS body 44 to rise to approximately the overvoltage value (close to +20V). With the source 71 of the auxiliary clamping PMOS transistor 70 coupled to ground and its gate 73 coupled to the positive (+15V) supply voltage terminal 46, clamping transistor 70 is turned on, providing a substantial leakage current path 68 from the output port 12 through the pn junction 52, turned-on PMOS device 61, turned-on the clamping PMOS device 70 and providing a current flow path to the grounded input port 11. This causes the parasitic bipolar transistor within the PMOS transmission gate device 40 to turn on hard, providing a very substantial current flow between the output port 12 and the input port 11, as shown by the current flow arrow 75, and the parasitic bipolar circuit diagram of FIG. 15.

Figure 16:
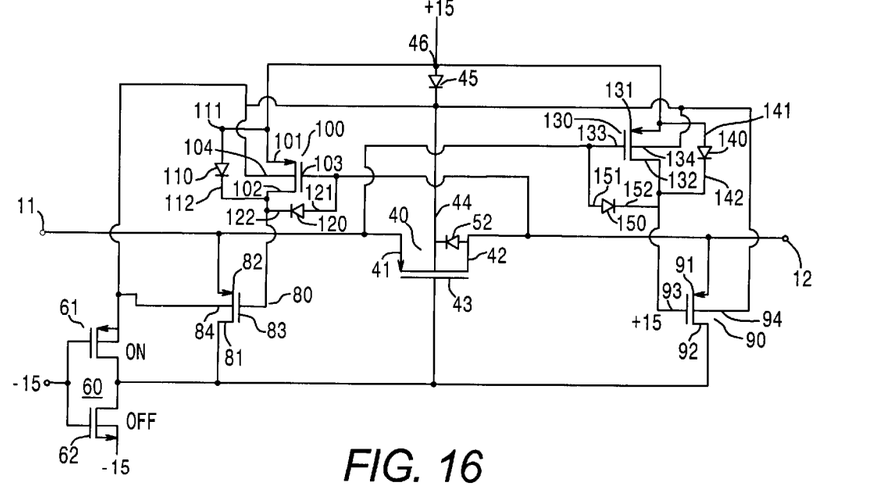
FIG. 16 diagrammatically illustrates a second embodiment of the transmission gate architecture of the invention, for providing overvoltage protection for an overvoltage applied to either the output or input port of the transmission gate.

Pursuant to a second embodiment of the present invention, schematically illustrated in FIG. 16, the inability of the single clamping device-based embodiment of FIG. 13 to provide overvoltage protection for an overvoltage applied to the output port of the transmission gate is successfully remedied by providing clamping MOS devices coupled on either side of the source-drain path of the transmission gate's MOS device. In addition, rather than coupling the gates of the clamping devices to the supply voltage terminal as in the embodiment of FIG. 13, the gates of the clamping devices are coupled in circuit with and controlled by associated clamping control MOS devices.

These additional clamping control devices have their source-drain paths coupled between the supply voltage and the gates of the clamping devices; also their gates are coupled to input and output ports. By installing such clamping control devices between the supply rail and the gates of the actual clamping devices on either side of the MOS transmission gate device, only that clamping device installed on the side of the transmission gate encountering the overvoltage condition will be turned on, whereas the clamping device on the opposite side of the transmission gate will be held off (by the blocking action to the supply, thus allowing a greater voltage to be applied to its gate by the associated turned-off clamping control devices).

When a respective clamping control transistor is turned on, it causes a voltage that is very close to the supply rail voltage to be applied to the gate of its associated clamping transistor. Since the source of the clamping transistor is coupled to the output port to which the overvoltage is applied, the clamping transistor is turned on, providing the intended overvoltage protection. Namely, in the second embodiment of the invention, the auxiliary clamping and clamping control transistor pairs are operative to controllably bring the drain and gate voltages of the transmission gate transistor to substantially the same overvoltage value in the case of an overvoltage applied to the output port, or to controllably bring the source and gate voltages of the transmission gate transistor to substantially the same overvoltage value in the case of an overvoltage applied to the input port.

More particularly, FIG. 16 shows a first, input side PMOS clamping transistor 80 having its source coupled 81. coupled to the input port 11, its drain 82 coupled to the gate 43 of PMOS transmission FET 40, to the common connected drains of PMOS device 61 and NMOS device 62 of inverter 60, and to the drain 92 of a second, output side PMOS clamping transistor 90. The PMOS clamping transistor 80 has its body 84 coupled to the body 44 of PMOS transmission FET 40 and its gate 83 coupled to the drain 102 of a clamping control PMOS transistor 100, and the cathodes 112 and 122 of a pair of diodes 110 and 120, respectively.

The clamping control PMOS transistor 100 has its source 101 coupled to the positive supply terminal 46 and to the anode 111 of diode 110. The gate 103 of clamping control PMOS transistor 100 is coupled to the anode 121 of diode 120 and to the drain 42 of the PMOS transmission gate transistor 40, which is coupled to the output port 12. The body 104 of the PMOS clamping control transistor 100 is coupled to the body 134 of a further PMOS clamping control transistor 130, as well as the body of PMOS transmission FET 40. Clamping control transistor 130 has is source 131 coupled to the positive supply terminal 46 and to the anode 141 of a diode 140. The gate 133 of the clamping control transistor 130 is coupled to the anode 151 of a diode 150 and to the source 41 of the PMOS transmission gate transistor 40, which is coupled to the input port 11.

The PMOS clamping transistor 90 has its body 94 coupled to the body 44 of PMOS transmission FET 40 and its source 91 coupled to the output port 12 and to the drain 42 of PMOS transmission gate transistor 40. The gate 93 of the PMOS clamping transistor 90 is coupled to the drain 132 of clamping control transistor 130, and to the cathodes 142 and 152 of diodes 140 and 150, respectively. The improved overvoltage protection circuitry of FIG. 16 operates as follows.

As a first example, the case of an overvoltage condition (e.g., +20V) applied to the output port 12 will be described. For this output port overvoltage condition, diagrammatically illustrated in FIG. 17, it will be assumed that the input port 11 is coupled to ground, as shown. With zero volts applied to its gate 133 from the output port 12, and the positive supply voltage (+15V) being applied to its source 131, the clamping control transistor 130 is turned on, thereby providing a shorting by-pass across diode 140, and causing a voltage that is very close to the positive supply rail voltage at terminal 46 to be applied to the gate 93 of the PMOS clamping transistor 90. Since the source 91 of clamping transistor 90 is coupled to the output port 12 to which the (+20V) overvoltage is applied, clamping transistor 90 is turned on.

Figure 17:
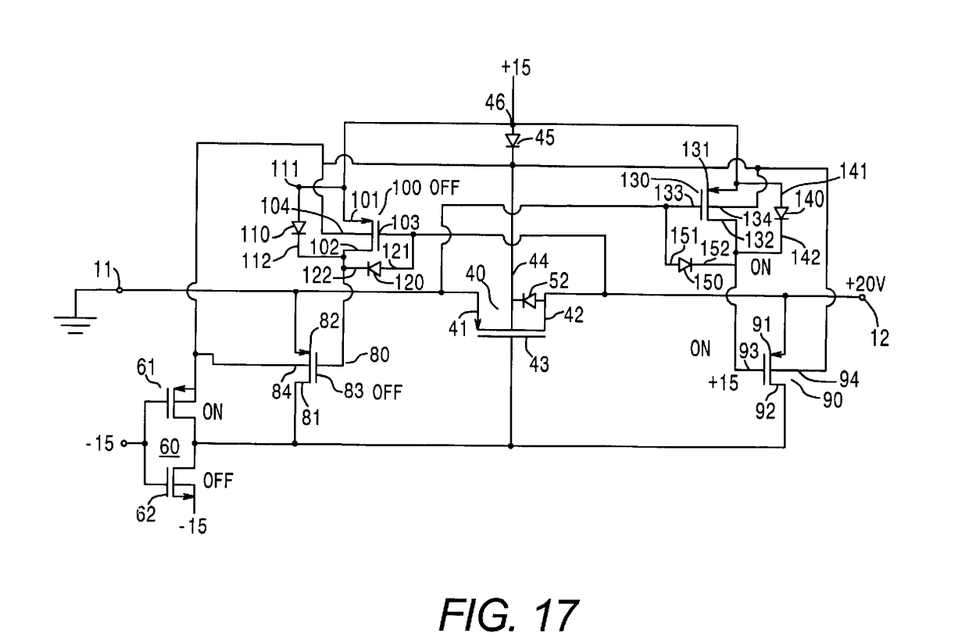
FIG. 17 shows the case of an overvoltage condition applied to the output port of the embodiment of the invention illustrated in FIG. 16.

In addition, the (+20V) overvoltage applied to the output port 12 is coupled to the gate 103 of the clamping control transistor 100. With +20V applied to its gate 103 and the positive supply voltage of +15V applied to its source 101, PMOS clamping control transistor 100 is off, so that there is no short across its associated source-drain coupled diode 110. Diode 110 operates in conjunction with diode 120, to allow the overvoltage (+20V) applied to the gate 103 of the clamping control PMOS transistor 100 (rather than the supply voltage (+15V) to be coupled (through diode 120) to the gate 83 of PMOS clamping transistor 80. As a consequence, the input side PMOS clamping transistor 80 is maintained in an off state.

Since the clamping control transistor 130 is turned on, as described above, the gate 43 of the PMOS transmission gate transistor 40 will acquire a voltage that is very close to the overvoltage value being applied to its drain 42, so that the desired overvoltage protection is provided. At the conclusion of the output port's overvoltage condition, the clamping control transistor 100 will turn on, thereby shorting out its source-drain diode 110, causing the charge to be drained off the gate 83 of the clamping transistor 80, reducing the voltage for normal operation.

Figure 18:
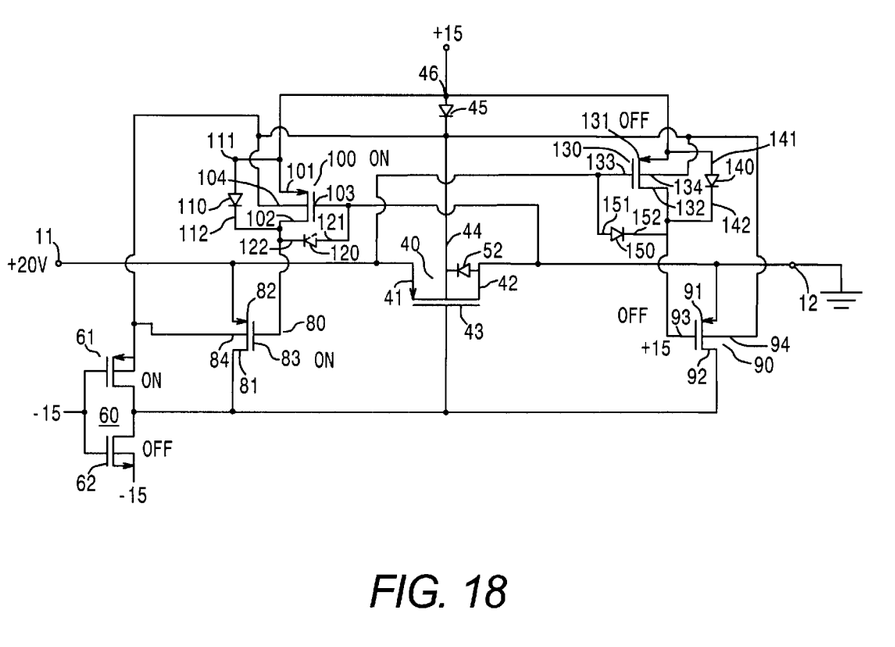
FIG. 18 shows the case of an overvoltage condition applied to the input port of the embodiment of the invention illustrated in FIG. 16.

As a second example, the case of an overvoltage condition (e.g., +20V) applied to the input port 11 will be described with reference to FIG. 18. Because of the mirror symmetry of the clamping and clamping control transistors in circuit with the transmission gate transistor 40 between the input and output ports, the reverse of the operation described above takes place. Again, for the input port overvoltage condition, it will be assumed that the output port 12 is now coupled to ground, as shown. With zero volts applied to its gate 103 and the positive supply voltage (+15V) applied to its source 101, clamping control transistor PMOS 100 is turned on, thereby providing a short by-pass across diode 110, and causing a voltage that is very close to the positive supply rail voltage at terminal 46 to be applied to the gate 83 of the input side PMOS clamping transistor 80. Since the drain 81 of the input side clamping transistor 80 is coupled to the input port 11 to which the (+20V) overvoltage is applied, the input side clamping transistor 80 is turned on.

The (+20V) overvoltage applied to the input port 11 is also coupled to the gate 133 of clamping control PMOS transistor 130. With +20V applied to its gate 133 and the positive supply voltage of +15V applied to its source 131, the clamping control PMOS transistor 130 is off, so that there is no short across its associated source-drain coupled diode 140. Like diode pair 110–120, diode 140 operates in conjunction with diode 150, to allow the overvoltage (+20V) applied to the gate 133 of the clamping control PMOS transistor 130 (rather than the supply voltage (+15V)) to be coupled (through diode 150) to the gate 93 of the output side PMOS clamping transistor 90. As a result, the output side PMOS clamping transistor 90 is maintained in an off state.

Since the clamping control transistor 100 is in its on state, the gate 43 of the PMOS transmission gate transistor 40 will acquire a voltage that is very close to the overvoltage value being applied to its source 41, so that the desired overvoltage protection is provided. At the conclusion of the input port's overvoltage condition, the clamping control transistor 130 will turn on, thereby shorting out its source-drain diode 140, causing the charge to be drained off the gate 93 of the output side clamping transistor 90, reducing the voltage for normal operation.

As will be appreciated from the foregoing description, the reduced overvoltage protection rating problem of a conventional bidirectional transmission gate is successfully addressed in accordance with the present invention, by incorporating at least one auxiliary 'clamping' device in circuit with the overvoltage path and the gate terminal of a transmission gate transistor. While a single auxiliary clamping device may be coupled in circuit with the input path as long as there is a defined output and only the input is subject to the possibility of an overvoltage condition, it is preferred that clamping devices be installed on either side of the source-drain path of the transmission gate device. In addition, the gates of the clamping devices are coupled in circuit with and controlled by associated clamping control MOS devices.

By installing clamping control devices between the supply rail and the gates of the actual clamping devices on either side of the MOS transmission gate device, only that clamping device installed on the side of the transmission gate encountering the overvoltage condition will be turned on, whereas the clamping device on the opposite side of the transmission gate will be held off (by the blocking action of its associated turned-off clamping control device).

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed is:

1. A transmission gate for controllably providing a conductivity path between a first port and a second port comprising:

a controlled switching device having a first input/output electrode coupled to said first port, a second input/output electrode coupled to said second port, and a control electrode adapted to receive a control input for controlling conductivity between said first and second input/output electrodes; and a controlled clamping device having a first electrode coupled to said first port, a second electrode coupled to the control electrode of said controlled switching device, and a control electrode coupled to receive a control voltage for controlling conductivity between said first and second electrodes of said controlled clamping device, and thereby, during an overvoltage condition, application to said control electrode of said controlled switching device of a voltage substantially corresponding to a voltage applied to said first port.

2. The transmission gate according to claim 1, wherein said controlled switching device comprises a first field effect transistor having a first input/output electrode thereof coupled to said first port, a second input/output electrode thereof coupled to said second port, a body coupled through a diode to a first voltage supply terminal, and a gate electrode thereof normally adapted to receive a control voltage for controlling conductivity between said first and second input/output electrodes.

3. The transmission gate according to claim 2, further including a gate driver circuit coupled between the body of said first field effect transistor, connected through a diode to said first voltage supply terminal and said gate electrode of said controlled switching device and being operative to controllably couple a voltage derived from that applied to the body of said first field effect transistor to the gate electrode of said controlled switching device for controlling the conductivity between said first and second input/output electrodes thereof.

4. The transmission gate according to claim 3, wherein said controlled clamping device comprises a second field effect transistor having said first electrode thereof coupled to said first port, said second electrode coupled to the gate electrode of said first field effect transistor, a body thereof coupled to receive a voltage derived from that applied to the body of said first field effect transistor, and a gate electrode coupled to receive a voltage derived from that applied to said first voltage supply terminal.

5. The transmission gate according to claim 4, wherein said gate driver circuit comprises an inverter circuit.

6. The transmission gate according to claim 1, further including a clamping control device coupled in circuit with the control electrode of said clamping device, and a terminal to which said control voltage for controlling conductivity between said first and second electrodes of said controlled clamping device is applied, and being operative to controllably enable the operation of said clamping device in accordance with a voltage applied to said second port.

7. The transmission gate according to claim 6, wherein said clamping control device has a first electrode coupled to the control electrode of said clamping device, a second electrode coupled to receive a first supply voltage, and a control electrode coupled to said second port to control the conductivity of said clamping control device.

8. The transmission gate according to claim 7, wherein said controlled switching device comprises a first field effect transistor having a first input/output electrode thereof coupled to said first port, a second input/output electrode thereof coupled to said second port, a body coupled through a diode to a first voltage supply terminal, and a gate electrode thereof normally adapted to receive a control voltage for controlling conductivity between said first and second input/output electrodes.

9. The transmission gate according to claim 8, wherein said controlled clamping device comprises a second field effect transistor having said first electrode thereof coupled to said first port, said second electrode coupled to the gate electrode of said first field effect transistor, a body thereof coupled to receive a voltage derived from that applied to the body of said first field effect transistor, and a gate electrode coupled to receive a voltage controllably provided by said clamping control device.

10. The transmission gate according to claim 9, wherein said clamping control device comprises a third field effect transistor having the first electrode thereof coupled to first voltage supply terminal, the second electrode thereof coupled to the gate electrode of said second field effect transistor, a body thereof coupled to receive a voltage derived from that applied to the body of said first field effect transistor, and a gate electrode thereof coupled to said second port.

11. The transmission gate according to claim 10, further including a first by-pass diode coupled between the first and second electrodes of said third field effect transistor, and a second by-pass diode coupled between the gate electrode and the second electrode of said third field effect transistor, said first and second by-pass diodes being operative to allow an overvoltage applied to the gate of said third field effect transistor to be coupled to the gate of said second field effect transistor.

12. A transmission gate for controllably providing a conductivity path between a first port and a second port comprising:

a controlled switching device having a first input/output electrode coupled to said first port, a second input/output electrode coupled to said second port, and a control electrode adapted to receive a control input for controlling conductivity between said first and second input/output electrodes;

a controlled clamping device having a first electrode coupled to said first port, a second electrode coupled to the control electrode of said controlled switching device, and a control electrode coupled to receive a control voltage for controlling conductivity between said first and second electrodes of said controlled clamping device, and thereby, during an overvoltage condition, application to said control electrode of said controlled switching device of a voltage substantially corresponding to a voltage applied to said first port; and a clamping control device coupled in circuit with the control electrode of said clamping device, and a terminal to which said control voltage for controlling conductivity between said first and second electrodes of said controlled clamping device is applied, and being operative to controllably enable the operation of said clamping device in accordance with a voltage applied to said second port.

13. The transmission gate according to claim 12, wherein said controlled switching device comprises a first field effect transistor having a first input/output electrode thereof coupled to said first port, a second input/output electrode thereof coupled to said second port, a body coupled through a diode to a first voltage supply terminal, and a gate electrode thereof normally adapted to receive a control voltage for controlling conductivity between said first and second input/output electrodes, said controlled clamping device comprises a second field effect transistor having a first electrode thereof coupled to said first port, a second electrode coupled to the gate electrode of said first field effect transistor, a body thereof coupled to receive a voltage derived from that applied to the body of said first field effect transistor, and a gate electrode coupled to receive a voltage derived from that applied to said first voltage supply terminal, and said clamping control device comprises a third field effect transistor having a first electrode thereof coupled to first voltage supply terminal, a second electrode thereof coupled to the gate electrode of said second field effect transistor, a body thereof coupled to receive a voltage derived from that applied to the body of said first field effect transistor, and a gate electrode thereof coupled to said second port.

14. The transmission gate according to claim 13, further including a gate driver circuit coupled between the body of said first field effect transistor connected through a diode to said first voltage supply terminal and said gate electrode of said controlled switching device and being operative to controllably couple a voltage derived from that applied to the body of said first field effect transistor to the gate electrode of said controlled switching device for controlling the conductivity between said first and second input/output electrodes thereof.

15. In a transmission gate for controllably providing a conductivity path between a first port and a second port, said transmission gate including a controlled switching device having a first input/output electrode coupled to said first port, a second input/output electrode coupled to said second port, a body coupled through a diode to a power supply terminal to which a supply voltage is applied, and a control electrode adapted to receive a control input for controlling conductivity between said first and second input/output electrodes, the improvement comprising:

a first controlled clamping device having a first electrode coupled to said first port, a second electrode coupled to the control electrode of said controlled switching device, and a control electrode coupled to receive a control voltage for controlling conductivity between said first and second electrodes of said first controlled clamping device, and thereby application to said control electrode of said controlled switching device of a voltage substantially corresponding to a voltage applied to said first port during an overvoltage event; and a first clamping control device coupled in circuit with the control electrode of said first controlled clamping device, and a terminal to which said control voltage for controlling conductivity between said first and second electrodes of said first controlled clamping device is applied, and being operative to controllably enable the operation of said first controlled clamping device in accordance with a voltage applied to said second port.

16. The improvement according to claim 15, further including a second controlled clamping device having a first electrode coupled to said second port, a second electrode coupled to the control electrode of said controlled switching device, and a control electrode coupled to receive a control voltage for controlling conductivity between said first and second electrodes of said second controlled clamping device, and thereby application to said control electrode of said controlled switching device of a voltage substantially corresponding to a voltage applied to said first port during an overvoltage event; and a second clamping control device coupled in circuit with the control electrode of said second clamping device, and said terminal to which said control voltage for controlling conductivity between said first and second electrodes of said second controlled clamping device is applied, and being operative to controllably enable the operation of said second controlled clamping device in accordance with a voltage applied to said first port.

17. The improvement according to claim 16, wherein said controlled switching device comprises a transmission gate field effect transistor having a first input/output electrode thereof coupled to said first port, a second input/output electrode thereof coupled to said second port, a body coupled through a diode to a first voltage supply terminal, and a gate electrode thereof normally adapted to receive a control voltage for controlling conductivity between said first and second input/output electrodes, said first controlled clamping device comprises a first clamping field effect transistor having a first electrode thereof coupled to said first port, a second electrode coupled to the gate electrode of said transmission gate field effect transistor, a body thereof coupled to receive a voltage derived from that applied to the body of said transmission gate field effect transistor, and a gate electrode coupled to receive a voltage derived from that applied to said first voltage supply terminal, and said first clamping control device comprises a first clamping control field effect transistor having a first electrode thereof coupled to said first voltage supply terminal, a second electrode thereof coupled to the gate electrode of said first clamping field effect transistor, a body thereof coupled to receive a voltage derived from that applied to the body of said transmission gate field effect transistor, and a gate electrode thereof coupled to said second port.

18. The improvement according to claim 17, wherein said second controlled clamping device comprises a second clamping field effect transistor having a first electrode thereof coupled to said second port, a second electrode coupled to the gate electrode of said transmission gate field effect transistor, a body thereof coupled to receive a voltage derived from that applied to the body of said transmission gate field effect transistor, and a gate electrode coupled to receive a voltage derived from that applied to said first voltage supply terminal, and said second clamping control device comprises a second clamping control field effect transistor having a first electrode thereof coupled to said first voltage supply terminal, a second electrode thereof coupled to the gate electrode of said second clamping field effect transistor, a body thereof coupled to receive a voltage derived from that applied to the body of said transmission gate field effect transistor, and a gate electrode thereof coupled to said first port.

19. The improvement according to claim 18, further including a gate driver circuit coupled between the body of said transmission gate field effect transistor, connected through a diode to said first voltage supply terminal and said gate electrode of said transmission gate field effect transistor and being operative to controllably couple a voltage derived from that applied to the body of said transmission gate field effect transistor to the gate electrode of said transmission gate field effect transistor for controlling the conductivity between said first and second input/output electrodes thereof.

* * * * *